United States Patent
Chen et al.

(10) Patent No.: US 11,687,240 B2
(45) Date of Patent: Jun. 27, 2023

(54) METHOD, ELECTRONIC DEVICE, AND COMPUTER PROGRAM PRODUCT FOR DATA COMPRESSION

(71) Applicant: EMC IP Holding Company LLC, Hopkinton, MA (US)

(72) Inventors: Tao Chen, Beijing (CN); Geng Han, Beijing (CN); Bing Liu, Tianjin (CN)

(73) Assignee: EMC IP HOLDING COMPANY LLC, Hopkinton, MA (US)

( * ) Notice: Subject to any disclaimer, the term of this patent is extended or adjusted under 35 U.S.C. 154(b) by 5 days.

(21) Appl. No.: 17/351,442

(22) Filed: Jun. 18, 2021

(65) Prior Publication Data

US 2022/0342554 A1      Oct. 27, 2022

(30) Foreign Application Priority Data

Apr. 21, 2021   (CN) ......................... 202110431811.7

(51) Int. Cl.
*G06F 3/06* (2006.01)
*H03M 7/30* (2006.01)
*H04L 69/04* (2022.01)

(52) U.S. Cl.
CPC .......... *G06F 3/0608* (2013.01); *G06F 3/0659* (2013.01); *G06F 3/0673* (2013.01); *H03M 7/30* (2013.01); *H04L 69/04* (2013.01)

(58) Field of Classification Search
CPC .... G06F 3/0608; G06F 3/0659; G06F 3/0673; H03M 7/30; H04L 69/04
See application file for complete search history.

(56) References Cited

U.S. PATENT DOCUMENTS

| | | | | |
|---|---|---|---|---|
| 5,649,151 | A | * | 7/1997 | Chu ...................... G06F 3/0601 711/111 |
| 9,959,072 | B2 | * | 5/2018 | Rostoker ............... G06F 3/0656 |
| 10,852,994 | B2 | * | 12/2020 | Subramanian ........ G06F 3/0673 |

* cited by examiner

*Primary Examiner* — Idriss N Alrobaye
*Assistant Examiner* — Richard B Franklin
(74) *Attorney, Agent, or Firm* — Womble Bond Dickinson (US) LLP

(57) ABSTRACT

Embodiments of the present disclosure provide a method, an electronic device, and a computer program product for data compression. The method includes: comparing the size of a first data packet to be compressed with a first threshold size; if the size of the first data packet is greater than the first threshold size, determining at least two second data packets from the first data packet, wherein the size of each second data packet is less than a second threshold size; and respectively compressing the at least two second data packets. In this way, the delay of data compression can be shortened.

20 Claims, 4 Drawing Sheets

METHOD, ELECTRONIC DEVICE, AND COMPUTER PROGRAM PRODUCT FOR DATA COMPRESSION

CROSS-REFERENCE TO RELATED APPLICATION

This patent application claims priority, under 35 U.S.C. § 119, of Chinese Patent Application No. 202110431881.7, filed Apr. 21, 2021, which is incorporated by reference in its entirety.

TECHNICAL FIELD

Embodiments of the present disclosure relate to the field of computers, and more particularly, to a method, an electronic device, and a computer program product for data compression.

BACKGROUND

In the era of Big Data, the conflict between the existence of massive data and the limited storage space of storage systems raises the need for compressing data. The inventor has observed that the size of a data packet to be compressed will affect the delay related to compression processing, and the greater the size of the data packet, the longer the delay related to compression processing. In other words, in a traditional storage system, the delay related to the compression processing of a larger data packet is longer, so that compression efficiency is not high.

SUMMARY OF THE INVENTION

The embodiments of the present disclosure provide a solution for data compression.

In a first aspect of the present disclosure, a method for data compression is provided. The method includes: comparing the size of a first data packet to be compressed with a first threshold size; if the size of the first data packet is greater than the first threshold size, determining at least two second data packets from the first data packet, wherein the size of each second data packet is less than or equal to a second threshold size; and respectively compressing the at least two second data packets.

In a second aspect of the present disclosure, an electronic device is provided, including a processor, and a memory coupled with the processor, wherein the memory has instructions stored therein, and the instructions cause the electronic device to perform actions when executed by the processor. The actions include: comparing the size of a first data packet to be compressed with a first threshold size; if the size of the first data packet is greater than the first threshold size, determining at least two second data packets from the first data packet, wherein the size of each second data packet is less than or equal to a second threshold size; and respectively compressing the at least two second data packets.

In a third aspect of the present disclosure, a computer program product is provided. The computer program product is tangibly stored on a computer-readable medium and includes machine-executable instructions. The machine-executable instructions, when executed, cause a machine to perform any steps of the method according to the first aspect.

The Summary of the Invention is provided to introduce the selection of concepts in a simplified form, which will be further described in the Detailed Description below. The Summary of the Invention is neither intended to identify key features or main features of the present disclosure, nor intended to limit the scope of the present disclosure.

BRIEF DESCRIPTION OF THE DRAWINGS

The above and other objectives, features, and advantages of the present disclosure will become more apparent by describing example embodiments of the present disclosure in more detail with reference to the accompanying drawings, and in the example embodiments of the present disclosure, the same reference numerals generally represent the same components. In the accompanying drawings.

DETAILED DESCRIPTION

Figure 1:
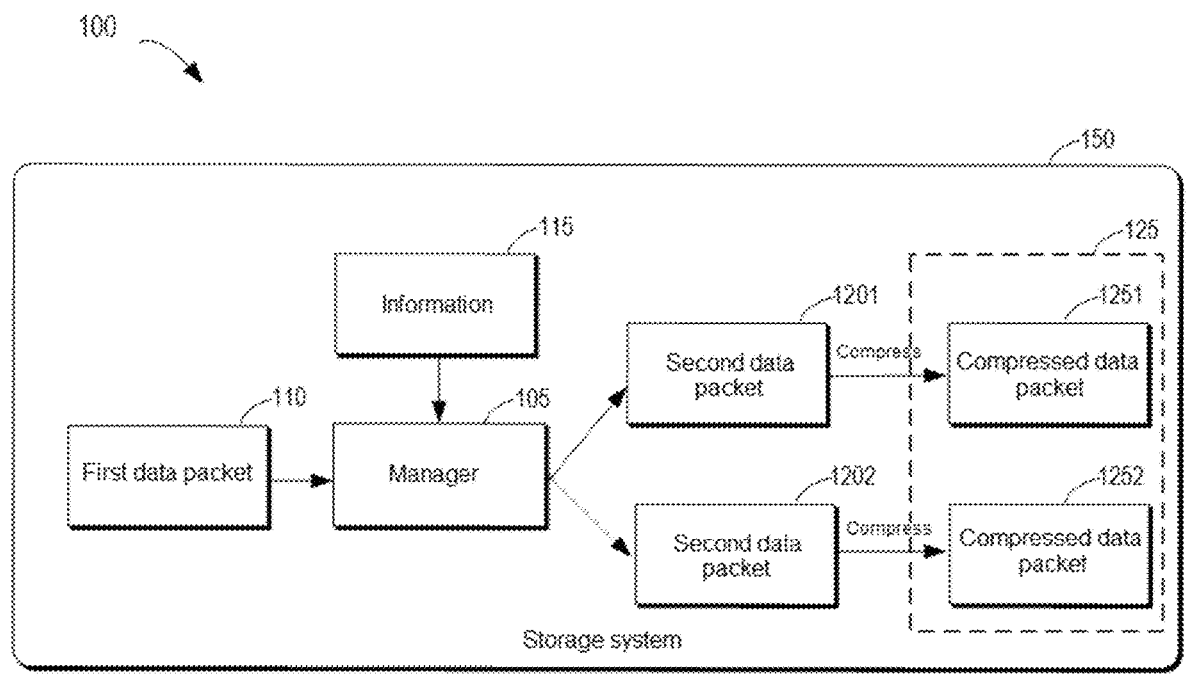
FIG. 1 illustrates a schematic diagram of an example environment according to an embodiment of the present disclosure.

The principles of the present disclosure will be described below with reference to some example embodiments shown in the accompanying drawings.

As used herein, the term "include" and variations thereof mean open-ended inclusion, i.e., "including but not limited to". Unless specifically stated, the term "or" means "and/or". The term "based on" means "based at least in part on". The terms "an example embodiment" and "an embodiment" indicate "a group of example embodiments". The term "another embodiment" indicates "a group of additional embodiments". The terms "first", "second", etc. may refer to different or the same objects. Other explicit and implicit definitions may also be included below.

As discussed above, in a storage system, the delay related to compression processing will be affected by the size of the data packet to be compressed. Data that need to be processed by the storage system have various sizes. An example of statistical results of the distribution of data packet sizes on the storage system shows that: data packets (sometimes also referred to as compression units) with a size less than or equal to 4 KB account for 1.02%, data packets with a size greater than 4 KB and less than or equal to 8 KB account for 5.86%, data packets with a size greater than 8 KB and less than or equal to 16 KB account for 11.9%, data packets with a size greater than 16 KB and less than or equal to 32 KB account for 13.64%, data packets with a size greater than 32 KB and less than or equal to 64 KB account for 19.44%, and data packets with a size greater than 64 KB and less than or equal to 128 KB account for 48.13%. The foregoing specific numerical values may change with different embodiments, but it will be understood that data packets in a large range of sizes account for a large proportion.

Through compression experiments, the inventor has found that the delay caused by a compression operation on a data packet in a larger size range (for example, 64 KB to 128 KB) is longer, and the delay related to the compression processing of the data packet in the larger size range (for example, 64 KB to 128 KB) is not necessarily proportional to the delay related to the compression processing of a data packet within a relatively small size range (for example, 32 KB to 64 KB). For example, in a storage system (which uses a corresponding co-processor to compress data) that employs QuickAssist accelerated compression technology (QAT), the following Table 1 shows experimental results of delays (unit: μs) caused by compressing data packets with different sizes (unit: KB) at different compression levels, i.e., dynamic compression level 3 and dynamic compression level 4.

TABLE 1

| Data packet size | 1 | 2 | 4 | 8 | 16 | 32 | 64 | 128 |
|---|---|---|---|---|---|---|---|---|
| Delay at dynamic compression level 3 | 25 | 29 | 39 | 63 | 130 | 216 | 354 | 829 |
| Delay at dynamic compression level 4 | 26 | 29 | 43 | 77 | 167 | 274 | 441 | 1158 |

It can be seen from Table 1 that the delay caused by compressing the data packet with a size of 128 KB exceeds twice the delay caused by compressing the data packet with a size of 64 KB. It will be understood that the compression levels are related to the compression technology used, and the QAT can provide dynamic compression level 1 to dynamic compression level 4, and static compression level 1 to static compression level 4. Just for brevity, the above table shows the delays related to dynamic compression level 3 and dynamic compression level 4; the delays associated with other compression levels have the same variation trend. Therefore, when the storage system compresses a large number of data packets in a large size range, the compression delay will be long, and thus, the efficiency is not high.

In order to address, at least in part, the above disadvantages, the embodiments of the present disclosure provide a solution for data compression. The solution can determine whether the size of a data packet to be compressed would cause a long compression delay, and if so, the data packet would be divided into two or more small data packets to be compressed respectively, so that the compression delay is reduced. Based on such a data compression mechanism, the compression delay caused by compressing a single large data packet can be reduced without affecting the quality and compatibility of the compressed data.

FIG. 1 is a schematic diagram of example environment 100 according to an embodiment of the present disclosure. In the example environment, a device and/or a method according to an embodiment of the present disclosure may be implemented. As shown in FIG. 1, example environment 100 may include storage system 150. Storage system 150 may include storage disk(s), not shown, for storing data (for example, compressed data packets). The storage disks may be various types of devices with a storage function, including but not limited to a hard disk drive (HDD), a solid state disk (SSD), a removable disk, any other magnetic storage device and any other optical storage device, or any combination thereof.

Storage system 150 may include manager 105 configured to manage various operations associated with the compression of first data packet 110. Manager 105 may be configured to receive a compression request containing first data packet 110. Manager 105 may be configured to determine whether to divide the first data packet based on information 115, so as to determine two second data packets 1201 and 1202 from first data packet 110. This may be achieved, for example, by dividing the compression request into two compression sub-requests, wherein each compression sub-request will contain a corresponding second data packet. It can be understood that more than two second data packets may also be determined from first data packet 110, as long as the delay caused by compressing the more than two second data packets will be less than the delay caused by compressing first data packet 110 that is undivided. In some embodiments, each second data packet may have the same size; in other words, the first data packet may be divided equally. In some embodiments, each second data packet may have a different size, as long as the size of each second data packet falls within a size range that makes the compression delay shorter. In some embodiments, manager 105 may be implemented by a computing device having computing capabilities in storage system 150.

In some embodiments, manager 105 may be configured to determine whether to divide first data packet 110 (and therefore, the associated compression request) based on information 115, and if so, divide first data packet 110 into two or more second data packets. In some embodiments, information 115 may include at least one of: a first threshold size for determining whether to divide first data packet 110; real-time overhead of the storage system, obtained from a system overhead monitor (not shown); the compression levels used in data packet compression, obtained from a compression level monitor (not shown) (for example, used by a QAT co-processor); and compression parameters obtained from a parameter database (not shown). In some embodiments, each compression parameter associated with each compression level is stored in the parameter database, and each compression parameter is used for determining the relationship between compression delay and the size of the data packet(s). In some embodiments, each compression parameter may be calculated in advance, and may be input to the parameter database for storage, for example, through a user control interface (not shown).

In some embodiments, manager 105 may divide first data packet 110 (and therefore, the associated compression request) to determine two second data packets, for example, if the size of the first data packet is greater than the first threshold size. In some embodiments, manager 105 may be further configured to determine whether to divide first data packet 110 (and therefore, the associated compression request) based on a comparison result between the real-time overhead and an overhead threshold, before determining whether the size of the first data packet is greater than the first threshold size. If the real-time overhead is less than the overhead threshold, manager 105 may determine that dividing the first data packet may promote a reduced compression delay, and thus may perform a comparison between the size of the first data packet and the first threshold size. Conversely, if the real-time overhead is greater than or equal to the overhead threshold, manager 105 may choose not to divide first data packet 110, but directly cause first data packet 110 to be compressed.

In some embodiments, manager 105 may cause the data packet(s) (in some embodiments, two second data packets 1201 and 1202) to be compressed by, for example, a compressor based on QuickAssist accelerated compression technology (QAT) to obtain the corresponding compressed data packet(s) (in some embodiments, corresponding compressed data packets 1251 and 1252), wherein the QAT-based compressor may be, for example, hardware different from the central processing unit of the storage system, and it is sometimes referred to as a co-processor. In some embodiments, the manager may (for example, simultaneously or asynchronously) send two or more compression sub-requests containing the second data packets to the compressor. In some embodiments, the manager may cause the compressor to be configured to sequentially compress the corresponding second data packet contained in each compression sub-request. In some embodiments, manager 105 may cause the compressor to be configured to compress the data packets according to the various compression levels provided by various compression technologies. In some embodiments, compressed data packet 1251 and compressed data packet 1252 together constitute compressed data packet 125 corresponding to first data packet 110.

A process according to an embodiment of the present disclosure will be described in detail below with reference to FIGS. 2 to 5. For ease of understanding, specific data mentioned in the following description is illustrative and is not intended to limit the protection scope of the present disclosure. In particular, for the convenience of description, some of the following embodiments are explained by dividing one first data packet into two second data packets, but it will be understood that the same concept may be applied to dividing one first data packet into more than two second data packets. It should be understood that the embodiments described below may also include additional actions that are not shown and/or may omit actions that are shown, and the scope of the present disclosure is not limited in this regard.

Figure 2:
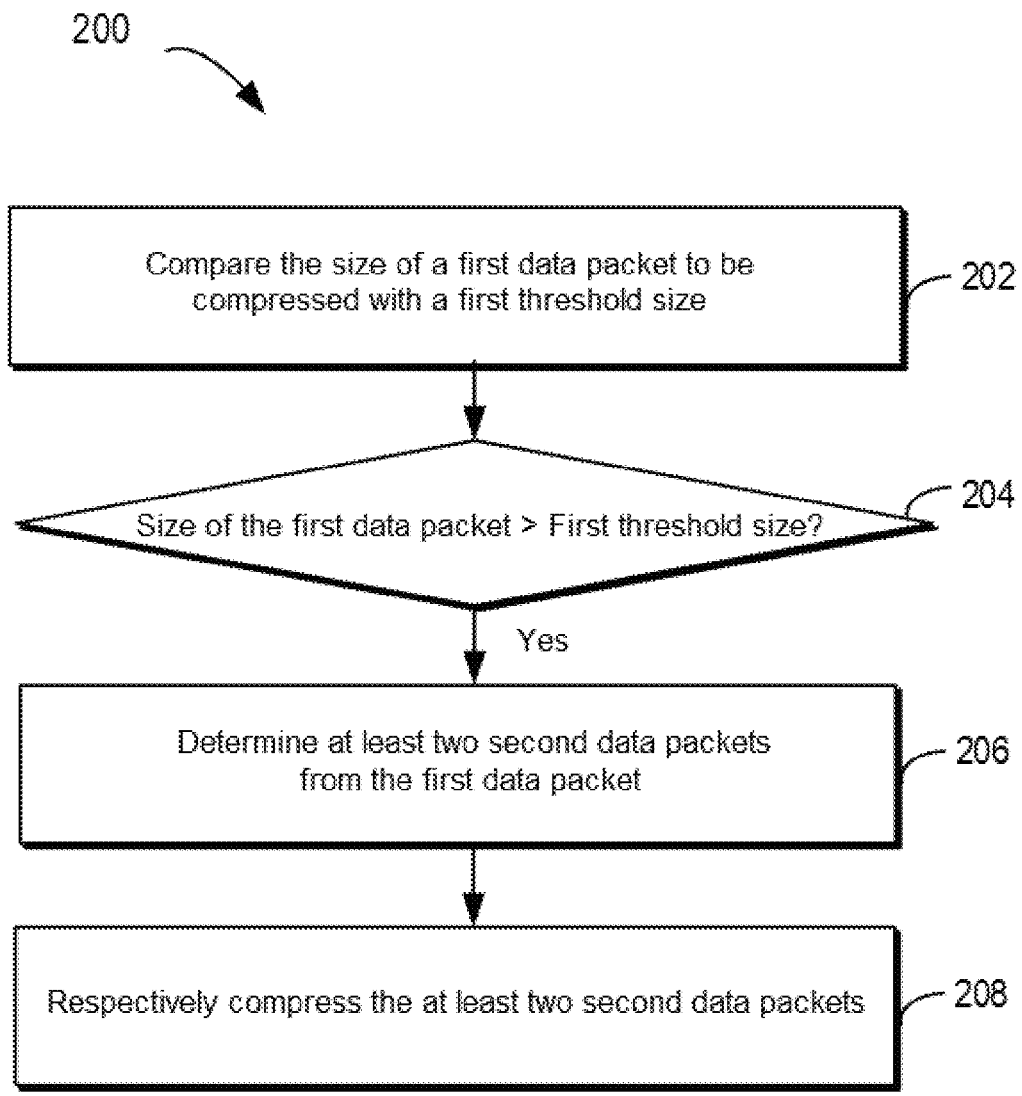
FIG. 2 illustrates a flow chart of a process of data compression according to an embodiment of the present disclosure.

FIG. 2 illustrates a flow chart of data compression process 200 according to an embodiment of the present disclosure. Process 200 may be implemented at manager 105 shown in FIG. 1. As shown in FIG. 2, at block 202, manager 105 may compare the size of first data packet 110 to be compressed with a first threshold size. In some embodiments, manager 105 may receive a compression request containing the first data packet, and determine the size of the first data packet contained in the compression request, wherein associating the data packet with the compression request can ensure the consistency and compatibility of the compressed data. The first threshold size may be a threshold used to determine whether the first data packet (and therefore, the compression request) needs to be divided. In other words, the delay caused by compressing the data packet with a size greater than the first threshold size will be longer than the total delay caused by respectively compressing the multiple data packets generated after dividing. In some embodiments, as various real-time parameters of the storage system change, such as system overhead, the first threshold size may be changed accordingly, and therefore, should be determined based on such real-time parameters. The process of determining the first threshold size will be described in detail below with reference to FIGS. 3 and 4.

At block 204, manager 105 may determine whether the size of first data packet 110 is greater than the first threshold size. If manager 105 determines that the size of first data packet 110 is greater than the first threshold size, then at 206, manager 105 may determine at least two second data packets (for example, 1201 and 1202) from the first data packet, and the size of each of the second data packets is less than or equal to a second threshold size. In some embodiments, manager 105 may divide the first data packet into at least two second data packets. In some embodiments, manager 105 equally divides the first data packet into at least two (for example, two) second data packets, and each of the second data packets has the same size. If manager 105 determines that the size of first data packet 110 is less than or equal to the first threshold size, manager 105 may choose not to divide first data packet 110 and cause first data packet 110 to be directly compressed. This may be accomplished by, for example, sending the compression request directly to the compressor for processing, without dividing the compression request.

In some embodiments, after receiving the compression request containing first data packet 110, the manager may divide the compression request into at least two compression sub-requests if it is determined that the size of first data packet 110 is greater than the first threshold size, wherein each compressed sub-request contains the corresponding second data packet. By associating multiple data packets with multiple compression sub-requests corresponding to the compression request, the consistency and compatibility of the compressed data can be further ensured.

At block 206, manager 105 may cause the at least two second data packets to be compressed respectively. In some embodiments, manager 105 may perform the compression operation on the data packets by causing the processor of the storage system to execute a compression algorithm. In some embodiments, manager 105 may perform the compression operation on the data packets by causing the co-processor (for example, based on the QAT described above) of the storage system to execute a compression algorithm.

In some embodiments, manager 105 may send the at least two compression sub-requests to the compressor of the storage system, so that the compressor sequentially compresses the corresponding second data packet contained in each compression sub-request. Sending the at least two compression sub-requests may advantageously be performed in a simultaneous or nearly simultaneous manner to reduce the real-time overhead of the storage system, which will be discussed in detail below. Of course, it can be understood that in the case of low system overhead, sending the at least two compression sub-requests may also be performed separately.

The compression process based on multiple divided compression sub-requests will not affect the corresponding decompression process. For example, for two compression sub-requests, two different flags, namely a first flag (for example, a flag corresponding to the first compression sub-request, which is CPA DC FLUSH FULL in QAT) and a second flag (for example, a flag corresponding to the second compression sub-request, which is CPA DC FLUSH FINAL in QAT) may be set respectively for the corresponding compression processing. The compression using the first flag will maintain checksum and length information among multiple compression sub-requests, and the compression using the second flag may indicate that the compression of a specific data segment contained in the first data packet has been completed. Compressed data packet 125 (including compressed data packets 1251 and 1252 obtained by processing the two compressed sub-requests separately) corresponding to first data packet 110 will be compatible with a compressed data packet obtained by directly compressing first data packet 110.

The compression process based on multiple divided compression sub-requests will not affect the compression rate. At the same compression level, the inventor has found that the data compression rate obtained after compressing a data packet with a small size is equivalent to that obtained after compressing a data packet with a large size; for example, at dynamic compression level 4, the data compression rate for a data packet with a size of 64 KB and the data compression rate for a data packet with a size of 128 KB are both about 35%.

In this way, when a data packet with a large size needs to be compressed, the manager can determine whether dividing the data packet can make the processing delay shorter, and select an approach that can make the processing delay shorter to compress the data packet, so that the delay related to the compression processing can be reduced without affecting compression processing performance, thereby improving the efficiency of the storage system.

Figure 3:
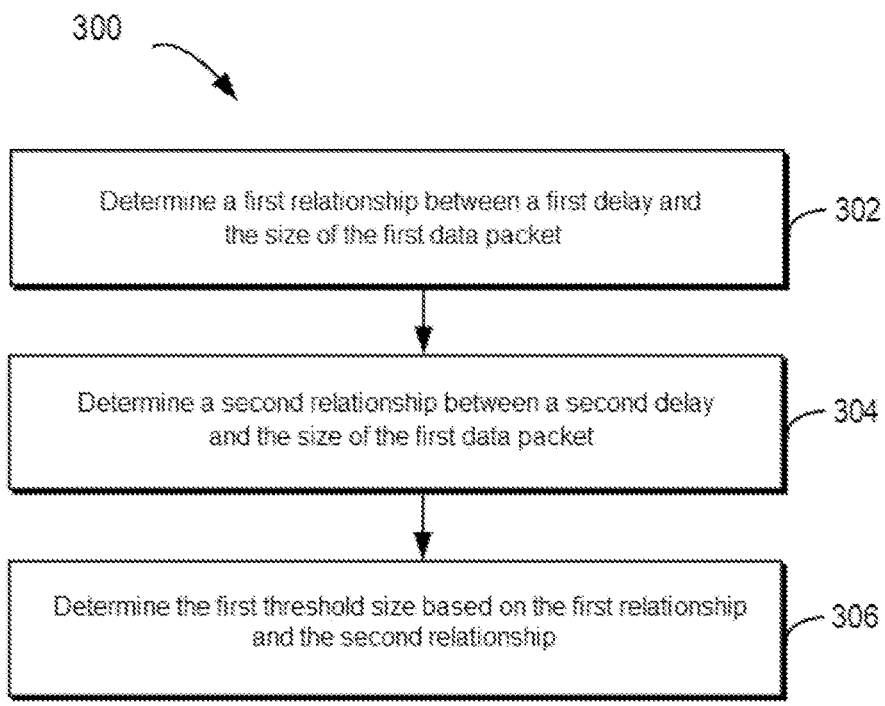
FIG. 3 illustrates a flow chart of a process of determining a first threshold size according to an embodiment of the present disclosure.
Figure 4:
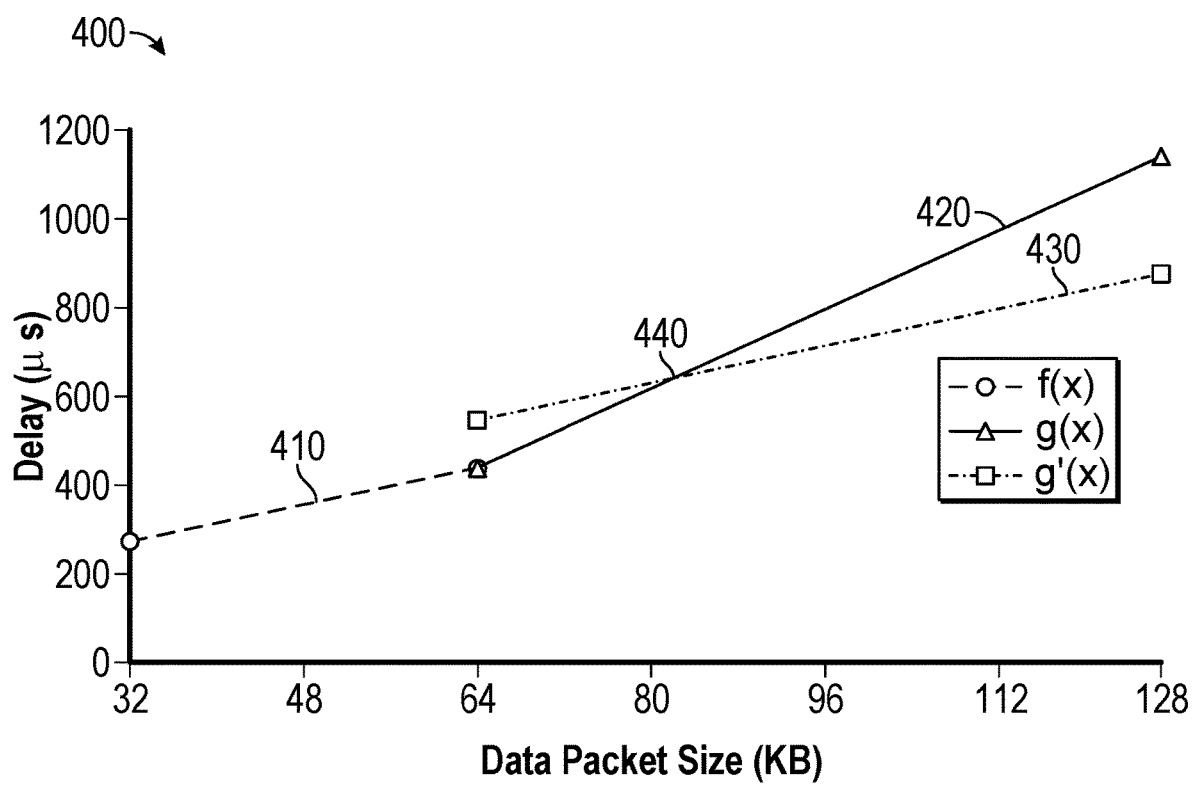
FIG. 4 illustrates a schematic diagram of a relationship between delays related to various compression processing and the size of a data packet according to an embodiment of the present disclosure.

FIG. 3 illustrates a flow chart of process 300 of determining a first threshold size according to an embodiment of the present disclosure. Process 300 can be implemented at manager 105 shown in FIG. 1. Process 300 is used to determine the first threshold size used in process 200. As shown in FIG. 3, at block 302, manager 105 may determine a first relationship between a first delay caused by compressing the first data packet and the size of the first data packet. For ease of description, a specific embodiment for determining the first relationship is described below with reference to FIG. 4 by way of example only. FIG. 4 illustrates schematic diagram 400 of a relationship between delays related to various compression processing and the size of a data packet according to an embodiment of the present disclosure. The embodiment of FIG. 4 assumes that the size of the first data packet is in a range of 64 KB to 128 KB, and the size of each second data packet is in a range of 32 KB to 64 KB. The first relationship between the first delay caused by directly compressing a single first data packet and the size of the first data packet may be expressed by the following equation (1).

$$f(x)=a\,x+b,\ x\in[64,128] \quad (1)$$

wherein f(x) represents a first delay, x represents the size of a data packet, and a and b are first parameters associated with the compression level used and the size range of the first data packet.

In some embodiments, the first parameters (including but not limited to the above a and b) may be predetermined through the following process, and for example, may be stored in the parameter database. For example, the manager may determine the compression level used in the compression process, and obtain the corresponding first parameters from the parameter database based on the compression level. For example, assuming that dynamic compression level 4 will be used, based on the example of data given in Table 1 above, a=11.203125 and b=−276 may be calculated to determine the first relationship represented by equation (1). When employing the above example data, the first relationship represented by equation (1) may be indicated by straight line 420 in FIG. 4, for example.

Referring back to FIG. 3, at block 304, manager 105 may determine a second relationship between the second delay caused by respectively compressing at least two second data packets and the size of the first data packet. Referring again to FIG. 4, it is also assumed that the size of the first data packet is in a range of 64 KB to 128 KB, the size of each second data packet is in a range of 32 KB to 64 KB, and the first data packet will be divided into two second packets with the same size. The second relationship between the second delay caused by respectively compressing the two second data packets and the size of the first data packet may be expressed by the following equations (2) and (3).

$$g(x)=a'x+b',\ x\in[32,64] \quad (2)$$

$$g'(x)=2*g(\tfrac{1}{2}x)=2*(\tfrac{1}{2}a'x+b')=a'x+2b',\ x\in[64,128] \quad (3)$$

wherein g(x) represents a delay caused by compressing a data packet with a size in the range of 32 KB to 64 KB, x represents the size of a data packet, and a' and b' are parameters associated with the compression level used and the size range of the data packet. g'(x) represents a second delay.

In some embodiments, the second parameters (including but not limited to the above a' and b') may be predetermined through the following process, and for example, may be stored in the parameter database. For example, the manager may determine the compression level used in the compression processing, and obtain the corresponding second parameters from the parameter database based on the compression level. For example, assuming that dynamic compression level 4 will be used, based on the example of data given in Table 1 above, a'=5.21875 and b'=107 may be calculated to determine the second relationship represented by equation (3). When employing the above example data, the relationship represented by equation (2) may, for example, be indicated by straight line 410 in FIG. 4, and the second relationship represented by equation (3) may, for example, be indicated by straight line 430 in FIG. 4.

Referring back to FIG. 3, at block 306, the manager may determine the first threshold size based on the first relationship and the second relationship. For example, the first threshold size may be determined by making equation (1) equal to equation (3), that is, by the following equation (4).

$$x=\frac{2b'-b}{a-a'} \quad (4)$$

Continuing to describe with reference to FIG. 4, it can be seen from FIG. 4 that straight line 430 and straight line 420 will have an intersection point 440, and the horizontal coordinate thereof corresponds to the first threshold size. On the right side of intersection point 440 (in other words, the size of the first data packet is greater than the first threshold size), the first delay will be greater than the second delay, and in this case, dividing the first data packet (and therefore, the associated compression request) is required. On the left side of intersection point 440 (in other words, the size of the first data packet is less than or equal to the first threshold size), the first delay will be smaller than or equal to the second delay, and in this case, dividing the first data packet (and therefore, the associated compression request) is not required. For example, assuming that dynamic compression level 4 is to be used, based on the foregoing first and second parameters, the first threshold size may be determined to be about 80.2 KB through equation (4).

In this way, the manager may accurately determine whether to divide the data packet and/or the compression request based on whether a dividing operation will result in a reduction in the overall compression delay.

In some embodiments wherein the manager causes the data packets to be compressed by, for example, the QAT-based co-processor, the real-time overhead of the storage system may be related to an additional delay caused by the following various delays, and in some embodiments, it may also be related to the sum of various delays: a delay caused by polling, a delay caused by context switching, and/or other delays related to data compression performed by, for example, the QAT-based co-processor. Dividing the compression request into two or more compression sub-requests may result in an increase in the additional delay. Therefore, considering the real-time overhead of the storage system, the above-mentioned first delay and second delay may respectively include a third delay related to the real-time overhead of the storage system. Considering the third delay related to the real-time overhead of the storage system, the above equations (1) to (4) may be expressed as the following equations (5) to (8), respectively.

$$f(x) = ax + b + c, x \in [64, 128] \quad (5)$$

$$g(x) = a'x + b' + c, x \in [32, 64] \quad (6)$$

$$g'(x) = a'x + 2b' + 2c, x \in [64, 128] \quad (7)$$

$$x = \frac{2b' - b + c}{a - a'} \quad (8)$$

wherein c can represent the third delay related to the real-time overhead of the storage system. In some implementations, considering that the real-time workload of the storage system changes, the additional delays (which are associated with the third delay) such as the delay caused by polling and the delay caused by context switching will change depending on the workload. Therefore, the third delay will change accordingly. Also, the first threshold size may change accordingly. In some embodiments, manager 105 may dynamically determine the first threshold size.

In some embodiments wherein the manager causes the data packet to be compressed by, for example, a QAT-based co-processor, before manager 105 performs the process of comparing the size of first data packet 110 with the first threshold size at block 202, it is also possible for manager 105 to perform a process of determining whether to perform a comparison with the above based on the system overhead (which will be described with reference to FIG. 5). This is because, as discussed above, dividing the compression request into two or more compression sub-requests may result in an increase in the additional delays. Therefore, in some such cases, dividing the compression request into two or more compression sub-requests cannot reduce the overall compression delay.

Figure 5:
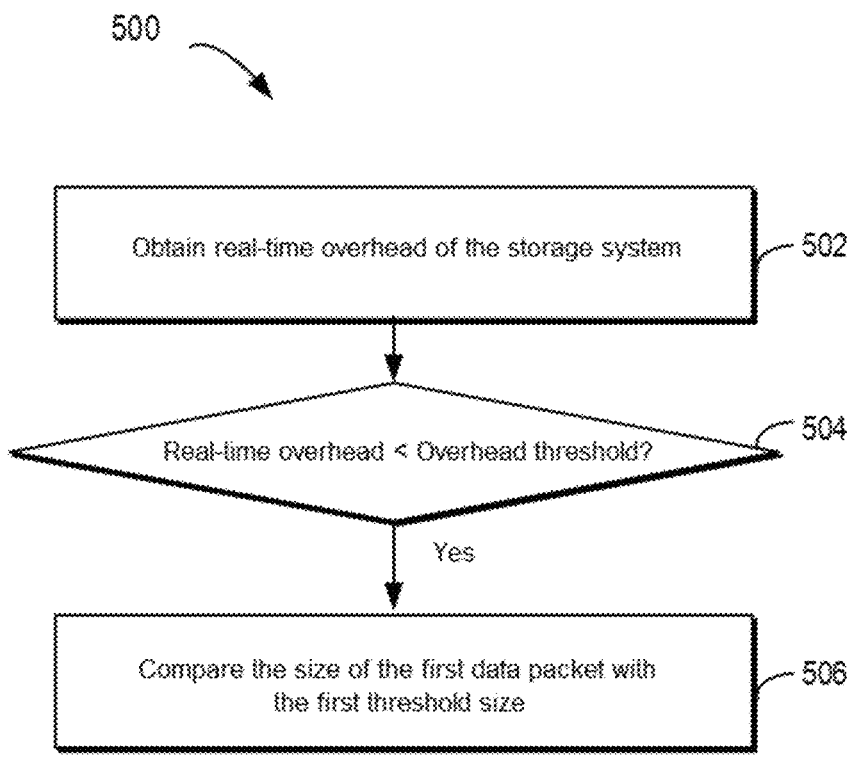
FIG. 5 illustrates a schematic diagram of a process of determining whether to perform a comparison related to the size of a data packet based on system overhead according to an embodiment of the present disclosure.

FIG. 5 illustrates a schematic diagram of process 500 of determining whether to perform a comparison related to the size of a data packet based on the system overhead according to an embodiment of the present disclosure. Process 500 can be implemented at manager 105 shown in FIG. 1. Process 500 may be executed before block 202 shown in FIG. 2, for example.

As shown in FIG. 5, at block 502, manager 105 may obtain the real-time overhead of the storage system, for example, from the overhead monitor of the storage system.

At block 504, manager 105 may determine whether the real-time overhead is less than a threshold overhead. If the real-time overhead is less than the threshold overhead, manager 105 may compare the size of the first data packet to be compressed with the first threshold size at block 506. If the real-time overhead is greater than or equal to the threshold overhead, manager 105 may determine that dividing the first data packet (and therefore, the associated compression request) is not required. This is because, in the case of larger real-time overhead, the additional delays caused by sending the two second data packets (and therefore, the associated compression sub-requests) to the compressor will also be longer, so that dividing the first data packet and/or compression requests cannot reduce the overall compression delay. It will be understood that the comparison process at block 506 is the same as the process at block 202 described with reference to FIG. 2 and will not be repeated here.

In some embodiments, the threshold overhead may be determined based on the above-mentioned first parameters, second parameters, and maximum size of the data packet to be compressed. For example, according to the above equation (8), the threshold overhead may be determined by the following equation (9).

$$c = (a-a')x + b - 2b', x = 128 \quad (9)$$

For example, for a data packet with a size in the range of 64 KB to 128 KB, by setting x to the maximum value of 128 KB in the range, the threshold overhead may be calculated to be about 278 μs.

In this way, the manager can take the real-time overhead factor of the storage system into consideration to further ensure that processing the compression request in a dividing manner can reduce the compression delay.

In some embodiments, the at least two compression sub-requests can be advantageously sent to the compressor in a simultaneous or nearly simultaneous manner to reduce the real-time overhead of the storage system. In this way, term 2b' in equations (3) and (7) approaches b', so that the threshold overhead can be increased and the first threshold size can be reduced.

Figure 6:
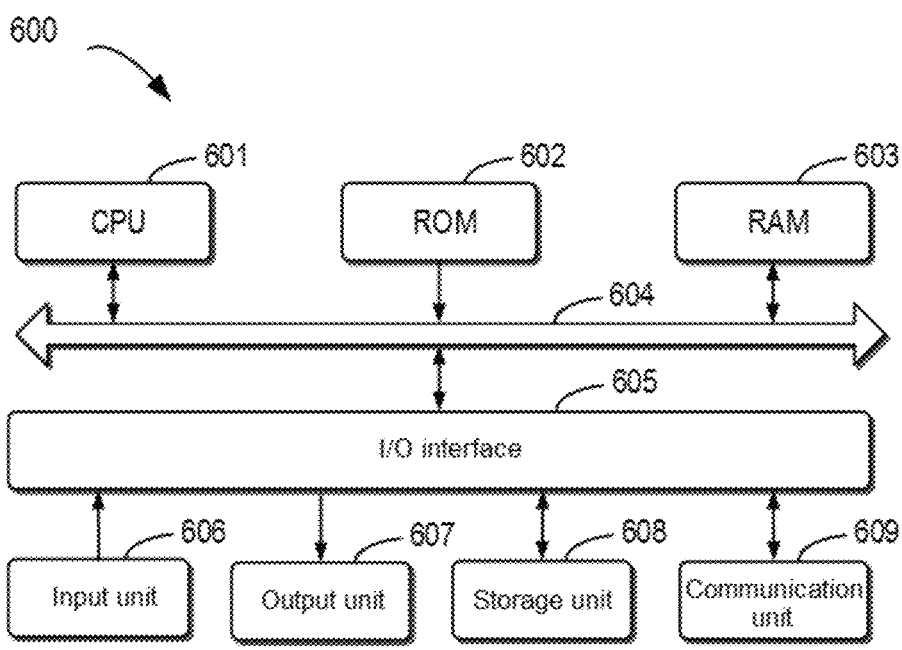
FIG. 6 illustrates a block diagram of an example device that may be used to implement an embodiment of the present disclosure.

FIG. 6 is a schematic block diagram of example electronic device 600 that may be used to implement an embodiment of the present disclosure. For example, electronic device 600 may be configured to implement computing device 105 as shown in FIG. 1. As shown, device 600 includes central processing unit (CPU) 601 that may perform various appropriate actions and processing according to computer program instructions stored in read-only memory (ROM) 602 or computer program instructions loaded from storage unit 608 into random access memory (RAM) 603. In RAM 603, various programs and data required for operations of device 600 may also be stored. CPU 601, ROM 602, and RAM 603 are connected to each other through bus 604. Input/output (I/O) interface 605 is also connected to bus 604.

Multiple components in device 600 are connected to I/O interface 605, including: input unit 606, such as a keyboard or a mouse; output unit 607, such as various types of displays and speakers; storage unit 608, such as a magnetic disk or an optical disc; and communication unit 609, such as a network card, a modem, or a wireless communication transceiver. Communication unit 609 allows device 600 to exchange information/data with other devices over a computer network such as the Internet and/or various telecommunication networks.

Processing unit 601 executes various methods and processing described above, for example, any one of processes 200, 300, and 500. For example, in some embodiments, any one of processes 200, 300, and 500 may be embodied as a computer software program or a computer program product that is tangibly included in a machine-readable medium, such as storage unit 608. In some embodiments, a part or all of the computer program may be loaded and/or installed onto device 600 via ROM 602 and/or communication unit 609. When the computer program is loaded into RAM 603 and executed by CPU 601, one or more steps of any one of processes 200, 300, and 500 described above may be performed. Alternatively, in other embodiments, CPU 601 may be configured in any other suitable manner (for example, by means of firmware) to implement any one of processes 200, 300, and 500.

The present disclosure may be a method, an apparatus, a system, and/or a computer program product. The computer program product may include a computer-readable storage medium on which computer-readable program instructions for performing various aspects of the present disclosure are loaded.

The computer-readable storage medium may be a tangible device capable of retaining and storing instructions used by an instruction-executing device. For example, the computer-readable storage medium may be, but is not limited to, an electric storage device, a magnetic storage device, an optical storage device, an electromagnetic storage device, a semiconductor storage device, any non-temporary storage device, or any suitable combination of the foregoing. More specific examples (a non-exhaustive list) of the computer-readable storage medium include: a portable computer disk, a hard disk, a random access memory (RAM), a read-only memory (ROM), an erasable programmable read-only memory (EPROM or flash memory), a static random access memory (SRAM), a portable compact disk read-only memory (CD-ROM), a digital versatile disk (DVD), a memory stick, a floppy disk, a mechanical coding device such as a punch card or protrusions in a groove on which instructions are stored, and any appropriate combination of the above. The computer-readable storage medium used herein is not to be interpreted as transient signals per se, such as radio waves or other freely propagating electromagnetic waves, electromagnetic waves propagated through waveguides or other transmission media (e.g., light pulses through fiber-optic cables), or electrical signals transmitted through electrical wires.

The computer-readable program instructions described herein may be downloaded from a computer-readable storage medium to various computing/processing devices or downloaded to an external computer or external storage device via a network, such as the Internet, a local area network, a wide area network, and/or a wireless network. The network may include copper transmission cables, fiber optic transmission, wireless transmission, routers, firewalls, switches, gateway computers, and/or edge servers. A network adapter card or network interface in each computing/processing device receives computer-readable program instructions from the network and forwards the computer-readable program instructions for storage in a computer-readable storage medium in each computing/processing device.

The computer program instructions for executing the operation of the present disclosure may be assembly instructions, instruction set architecture (ISA) instructions, machine instructions, machine-dependent instructions, microcode, firmware instructions, state setting data, or source code or object code written in any combination of one or more programming languages, including an object oriented programming language, such as Smalltalk, C++, and conventional procedural programming languages, such as "C" language or similar programming languages. The computer-readable program instructions may be executed entirely on a user's computer, partly on a user's computer, as a stand-alone software package, partly on a user's computer and partly on a remote computer, or entirely on a remote computer or a server. When a remote computer is involved, the remote computer can be connected to a user computer through any kind of network, including a local area network (LAN) or a wide area network (WAN), or can be connected to an external computer (for example, connected through the Internet using an Internet service provider). In some embodiments, an electronic circuit, such as a programmable logic circuit, a field programmable gate array (FPGA), or a programmable logic array (PLA), is customized by utilizing state information of the computer-readable program instructions. The electronic circuit may execute the computer-readable program instructions to implement various aspects of the present disclosure.

Various aspects of the present disclosure are described herein with reference to flowcharts and/or block diagrams of the method, the apparatus (system), and the computer program product according to the embodiments of the present disclosure. It should be understood that each block of the flow charts and/or block diagrams and combinations of blocks in the flow charts and/or block diagrams may be implemented by computer-readable program instructions.

These computer-readable program instructions may be provided to a processing unit of a general-purpose computer, a special-purpose computer, or a further programmable data processing apparatus, thereby producing a machine, such that these instructions, when executed by the processing unit of the computer or the further programmable data processing apparatus, produce means for implementing functions/actions specified in one or more blocks in the flow charts and/or block diagrams. These computer-readable program instructions may also be stored in a computer-readable storage medium, and these instructions cause a computer, a programmable data processing apparatus, and/or other devices to operate in a specific manner; and thus the computer-readable medium having instructions stored includes an article of manufacture that includes instructions that implement various aspects of the functions/actions specified in one or more blocks in the flow charts and/or block diagrams.

The computer-readable program instructions may also be loaded to a computer, a further programmable data processing apparatus, or a further device, so that a series of operating steps may be performed on the computer, the further programmable data processing apparatus, or the further device to produce a computer-implemented process, such that the instructions executed on the computer, the further programmable data processing apparatus, or the further device may implement the functions/actions specified in one or more blocks in the flow charts and/or block diagrams.

The flowcharts and block diagrams in the drawings illustrate the architectures, functions, and operations of possible implementations of the systems, methods, and computer program products according to various embodiments of the present disclosure. In this regard, each block in the flow charts or block diagrams may represent a module, a program segment, or part of an instruction, the module, program segment, or part of an instruction including one or more executable instructions for implementing specified logical functions. In some alternative implementations, functions marked in the blocks may also occur in an order different from that marked in the accompanying drawings. For example, two successive blocks may actually be executed basically in parallel, and sometimes they may also be executed in an inverse order, which depends on the functions involved. It should be further noted that each block in the block diagrams and/or flow charts as well as a combination of blocks in the block diagrams and/or flow charts may be implemented using a special hardware-based system that executes specified functions or actions, or using a combination of special hardware and computer instructions.

Various implementations of the present disclosure have been described above. The foregoing description is illustrative rather than exhaustive, and is not limited to the disclosed implementations. Numerous modifications and alterations are apparent to persons of ordinary skill in the art without departing from the scope and spirit of the illustrated implementations. The selection of terms used herein is intended to best explain the principles and practical applications of the implementations or the improvements to technologies on the market, or to enable other persons of ordinary skill in the art to understand the implementations disclosed herein.

The invention claimed is:

1. A method for data compression, comprising:
   comparing a size of a first data packet to be compressed with a first threshold size, the first threshold size being determined based on at least a processing delay caused by compressing the first data packet;
   if the size of the first data packet is greater than the first threshold size, determining at least two second data packets from the first data packet, wherein a size of each second data packet is less than or equal to a second threshold size; and
   respectively compressing the at least two second data packets.

2. The method according to claim 1, further comprising:
   receiving a compression request containing the first data packet; and
   determining the size of the first data packet in the compression request.

3. The method according to claim 2, wherein determining the at least two second data packets from the first data packet comprises:
   dividing the compression request into at least two compression sub-requests, each of which contains a corresponding second data packet.

4. The method according to claim 3, wherein respectively compressing the at least two second data packets comprises:
   sending the at least two compression sub-requests to a compressor of a storage system, so that the compressor sequentially compresses the corresponding second data packet contained in each compression sub-request.

5. The method according to claim 1, further comprising:
   determining a first relationship between a first delay caused by compressing the first data packet and the size of the first data packet;
   determining a second relationship between a second delay caused by respectively compressing the at least two second data packets and the size of the first data packet; and
determining the first threshold size based on the first relationship and the second relationship.

6. The method according to claim 5, wherein the first delay and the second delay respectively comprise a third delay related to a real-time overhead of a storage system.

7. The method according to claim 5, wherein determining the first relationship and the second relationship comprises:
   determining a compression level used; and
   based on the compression level, obtaining first parameters and second parameters to respectively determine the first relationship and the second relationship.

8. The method according to claim 1, wherein comparing the size of the first data packet to be compressed with the first threshold size comprises:
   obtaining a real-time overhead of a storage system; and
   if the real-time overhead is less than a threshold overhead, comparing the size of the first data packet to be compressed with the first threshold size.

9. The method according to claim 1, wherein each of the at least two second data packets has the same size.

10. An electronic device, comprising: a processor; and
    a memory coupled to the processor and having instructions stored therein, which when executed by the processor, cause the electronic device to perform actions, the actions comprising:
    comparing a size of a first data packet to be compressed with a first threshold size, the first threshold size being determined based on at least a processing delay caused by compressing the first data packet;
    if the size of the first data packet is greater than the first threshold size, determining at least two second data packets from the first data packet, wherein a size of each second data packet is less than or equal to a second threshold size; and
    respectively compressing the at least two second data packets.

11. The device according to claim 10, wherein the actions further comprise:
    receiving a compression request containing the first data packet; and
    determining the size of the first data packet in the compression request.

12. The device according to claim 11, wherein determining the at least two second data packets from the first data packet comprises:
    dividing the compression request into at least two compression sub-requests, each of which contains a corresponding second data packet.

13. The device according to claim 12, wherein respectively compressing the at least two second data packets comprises:
    sending the at least two compression sub-requests to a compressor of a storage system, so that the compressor sequentially compresses the corresponding second data packet contained in each compression sub-request.

14. The device according to claim 10, wherein the actions further comprise:
    determining a first relationship between a first delay caused by compressing the first data packet and the size of the first data packet;
    determining a second relationship between a second delay caused by respectively compressing the at least two second data packets and the size of the first data packet; and
    determining the first threshold size based on the first relationship and the second relationship.

15. The device according to claim 14, wherein the first delay and the second delay respectively comprise a third delay related to a real-time overhead of a storage system.

16. The device according to claim 14, wherein determining the first relationship and the second relationship comprises:
    determining a compression level used; and
    based on the compression level, obtaining first parameters and second parameters to respectively determine the first relationship and the second relationship.

17. The device according to claim 10, wherein comparing the size of the first data packet to be compressed with the first threshold size comprises:
    obtaining a real-time overhead of a storage system; and
    if the real-time overhead is less than a threshold overhead, comparing the size of the first data packet to be compressed with the first threshold size.

18. The device according to claim 10, wherein each of the at least two second data packets has the same size.

19. A computer program product tangibly stored in a non-transitory computer-readable medium and comprising machine-executable instructions, which when executed by a machine, cause the machine to perform a method, the method comprising:

comparing a size of a first data packet to be compressed with a first threshold size, the first threshold size being determined based on at least a processing delay caused by compressing the first data packet;

if the size of the first data packet is greater than the first threshold size, determining at least two second data packets from the first data packet, wherein a size of each second data packet is less than or equal to a second threshold size; and respectively compressing the at least two second data packets.

20. The computer program product according to claim 19, wherein the method further comprises:

receiving a compression request containing the first data packet; and determining the size of the first data packet in the compression request.

\* \* \* \* \*